(12) United States Patent
Nickel et al.

(10) Patent No.: US 9,157,930 B2
(45) Date of Patent: Oct. 13, 2015

(54) BIDIRECTIONAL RADIO-FREQUENCY PROBING

(75) Inventors: Joshua G. Nickel, San Jose, CA (US);
Fernando Urioste, Pleasanton, CA (US); Justin Gregg, San Francisco, CA (US); Adil Syed, Santa Clara, CA (US); Jason Sloey, San Jose, CA (US); Jonathan Haylock, Los Angeles, CA (US)

(73) Assignee: Apple Inc., Cupertino, CA (US)

( * ) Notice: Subject to any disclaimer, the term of this patent is extended or adjusted under 35 U.S.C. 154(b) by 1177 days.

(21) Appl. No.: 13/103,892

(22) Filed: May 9, 2011

(65) Prior Publication Data
US 2012/0287792 A1     Nov. 15, 2012

(51) Int. Cl.
| | |
|---|---|
| *G01R 31/302* | (2006.01) |
| *G01R 1/067* | (2006.01) |
| *G01R 31/28* | (2006.01) |
| *H04B 17/00* | (2015.01) |
| *H04B 17/12* | (2015.01) |
| *H04B 17/16* | (2015.01) |

(52) U.S. Cl.
CPC ........ *G01R 1/06772* (2013.01); *G01R 31/2822* (2013.01); *H04B 17/0085* (2013.01); *H04B 17/12* (2015.01); *H04B 17/16* (2015.01)

(58) Field of Classification Search
CPC ................... H01L 2223/6677; G01R 29/0878; G01R 1/24; G01R 27/2676; H04M 1/24; G01S 3/02; G01S 5/02
USPC ................................ 324/754.31, 629, 756.06
See application file for complete search history.

(56) References Cited

U.S. PATENT DOCUMENTS

| | | | | |
|---|---|---|---|---|
| 5,577,269 | A | * | 11/1996 | Ludewig ..................... 455/575.7 |
| 5,710,984 | A | * | 1/1998 | Millar et al. .................... 455/80 |
| 5,726,566 | A | * | 3/1998 | Quist et al. ....................... 324/95 |
| 5,832,372 | A | * | 11/1998 | Clelland et al. ............. 455/115.2 |
| 5,963,853 | A | * | 10/1999 | Berg et al. ........................ 455/77 |
| 6,032,054 | A | | 2/2000 | Schwinke |
| 6,452,379 | B1 | * | 9/2002 | Cartier ..................... 324/755.02 |
| 6,469,673 | B2 | * | 10/2002 | Kaiponen ..................... 343/703 |
| 7,020,443 | B2 | * | 3/2006 | Talvitie et al. ............. 455/67.14 |

(Continued)

FOREIGN PATENT DOCUMENTS

| | | |
|---|---|---|
| CN | 201004681 | 1/2008 |
| CN | 1013112356 | 11/2008 |

(Continued)

*Primary Examiner* — Tung X Nguyen
*Assistant Examiner* — Giovanni Astacio-Oquendo
(74) *Attorney, Agent, or Firm* — Treyz law Group; Jason Tsai

(57) ABSTRACT

Wireless electronic devices may include wireless communications circuitry such as a transceiver, antenna, and other wireless circuitry. The transceiver may be coupled to the antenna through a bidirectional switch connector. The switch connector may mate with a corresponding radio-frequency test probe that is connected to radio-frequency test equipment. When the test probe is mated with the switch connector, the transceiver may be decoupled from the antenna. During transceiver testing, radio-frequency test signals may be conveyed between the test unit and the transceiver using the test probe. During antenna testing, radio-frequency test signals may be conveyed between the test unit and the antenna using the test probe. Transceiver testing and antenna testing may, if desired, be conducted in parallel using the test probe.

14 Claims, 12 Drawing Sheets

(56) References Cited

U.S. PATENT DOCUMENTS

| | | | |
|---|---|---|---|
| 7,161,544 B2* | 1/2007 | Vance | 343/702 |
| 7,598,924 B2* | 10/2009 | Hynes et al. | 343/906 |
| 7,796,955 B2 | 9/2010 | Gau et al. | |
| 8,587,335 B2* | 11/2013 | Gregg et al. | 324/756.06 |
| 2004/0175978 A1* | 9/2004 | Mugiuda et al. | 439/188 |
| 2009/0004991 A1 | 1/2009 | Juang | |
| 2009/0146891 A1* | 6/2009 | Chen | 343/745 |
| 2010/0295569 A1* | 11/2010 | Chu et al. | 324/754 |
| 2011/0003564 A1* | 1/2011 | Descombes et al. | 455/84 |
| 2011/0039504 A1* | 2/2011 | Nguyen et al. | 455/78 |
| 2011/0237199 A1* | 9/2011 | Venkataraman et al. | 455/67.11 |

FOREIGN PATENT DOCUMENTS

| | | | |
|---|---|---|---|
| JP | 2002-042985 A | † | 2/2002 |
| JP | 2008-226588 | * | 9/2008 |
| JP | 2008-226588 A | † | 9/2008 |
| JP | 2009-129690 A | † | 6/2009 |
| KR | 2008054856 | | 6/2008 |
| TW | M320189 U | | 10/2007 |

* cited by examiner
† cited by third party

BIDIRECTIONAL RADIO-FREQUENCY PROBING

BACKGROUND

This relates to testing and, more particularly, to testing of electronic devices.

Electronic devices such as computers, cellular telephones, music players, and other electronic equipment are often provided with wireless communications circuitry. In a typical configuration, the wireless communications circuitry includes a radio-frequency transceiver that is coupled to an antenna through a radio-frequency switch connector.

A conventional radio-frequency switch connector contains a movable terminal and a fixed terminal. The movable terminal is electrically connected to the radio-frequency transceiver, whereas the fixed terminal is electrically connected to the antenna. During normal device operation, the switch connector serves to electrically connect the transceiver to the antenna so that radio-frequency signals can be conveyed between the transceiver and the antenna.

During production testing, the switch connector may be mated with a corresponding coaxial test probe having a measurement pin. When the coaxial test probe is in the mated state, the measurement pin of the coaxial test probe makes contact with and displaces the movable terminal so that the movable terminal is disconnected from the fixed terminal. Decoupling the antenna from the transceiver using this approach allows for radio-frequency testing on the transceiver but not the antenna.

It would therefore be desirable to be able to provide improved device structures and test equipment that allow radio-frequency testing on the transceiver and the antenna.

SUMMARY

Electronic devices may include wireless transceiver circuitry and antenna circuitry. The transceiver circuitry may include a cellular telephone transceiver, a wireless local area network transceiver, a satellite navigation systems transceiver, and other wireless communications circuits. The antenna circuitry may include at least one antenna resonating element associated with a loop antenna, inverted-F antenna, strip antenna, planar inverted-F antenna, slot antenna, hybrid antenna that includes antenna structures of more than one type, or other suitable types of antennas.

The transceiver may be coupled to the antenna through a transmission line path (e.g., a path that includes one or more conductive trace segments, one or more radio-frequency cable segments, or other conductive paths suitable for conveying radio-frequency signals). A bidirectional switch connector may be interposed in the transmission line path between the transceiver and the antenna. The switch connector and the transceiver may be mounted on a semiconductor substrate (e.g., a printed circuit board). The switch connector may be mounted on the substrate or may be embedded in the substrate (e.g., the switch connector may be inserted in a corresponding slot in the printed circuit board).

The switch connector may include a first conductive member and a second conductive member. The first conductive member may be coupled to the transceiver, whereas the second conductive member may be coupled to the antenna. In some embodiments, the first and second conductive members are in direct physical contact with each other when the switch connector is in the unmated state. In other embodiments, the first and second conductive members are coupled to each other via a conductive shorting member when the switch connector is in the unmated state.

During radio-frequency test operations, test equipment may be connected to the switch connector to perform transceiver testing and antenna testing. The test equipment may include a radio-frequency test probe that can be used to mate with the bidirectional switch connector, a test unit that generates and analyzes radio-frequency test signals, and radio-frequency cabling (e.g., coaxial cables) that connects the test unit to the test probe.

In one suitable arrangement, the test probe may include a first conductive signal pin, a second conductive signal pin, and a ground pin. When the test probe is mated with the switch connector, the first conductive signal pin makes physical contact with the first conductive member, the second conductive signal pin makes physical contact with the second conductive member, and the ground pin makes physical contact with a corresponding grounding structure on the substrate. Mating the test probe in this way may decouple the first conductive member from the second conductive member (e.g., by causing at least one of the first and second conductive members to bend away from each other or by causing at least one of the first and second conductive members to be disconnected from the shorting member). The test unit may be used to send radio-frequency test signals through a first test port in the test unit, a first radio-frequency cable that is connected to the first test port, and the first signal pin to perform transceiver testing. The test unit may be used to send radio-frequency test signals through a second test port in the test unit, a second radio-frequency cable that is connected to the second test port, and the second signal pin to perform antenna testing. Transceiver testing and antenna testing may be performed in parallel, if desired.

In another suitable arrangement, the test probe may include a single conductive signal pin and a ground pin. The conductive signal pin may be configured to make contact with a selected one of the first and second conductive members. The test probe having a signal pin that is configured to make contact with the first conductive member is suitable for use during transceiver testing, whereas the test probe having a signal pin that is configured to make contact with the second conductive member is suitable for using during antenna testing.

In another suitable arrangement, the test probe may include a conductive signal pin, a nonconductive (or dummy) test pin, and a ground pin. The conductive signal pin may be configured to make contact with a selected one the first and second conductive members, whereas the nonconductive test pin may be configured to make contact with the conductive member other than the selected conductive member. The test probe having a conductive signal pin that is configured to make contact with the first conductive member and a dummy test pin that is configured to make contact with the second conductive member is suitable for use during transceiver testing, whereas the test probe having a conductive signal pin that is configured to make contact with the second conductive member and a dummy test pin that is configured to make contact with the first conductive member is suitable for using during antenna testing.

Further features of the present invention, its nature and various advantages will be more apparent from the accompanying drawings and the following detailed description.

DETAILED DESCRIPTION

Wireless electronic devices include antenna and transceiver circuitry that support wireless communications. Examples of wireless electronic devices include desktop computers, computer monitors, computer monitors containing embedded computers, wireless computer cards, wireless adapters, televisions, set-top boxes, gaming consoles, routers, and other electronic equipment. Examples of portable wireless electronic devices include laptop computers, tablet computers, handheld computers, cellular telephones, media players, and small devices such as wrist-watch devices, pendant devices, headphone and earpiece devices, and other miniature devices.

Devices such as these are often provided with wireless communications capabilities. For example, electronic devices may use long-range wireless communications circuitry such as cellular telephone circuitry to communicate using cellular telephone bands at 850 MHz, 900 MHz, 1800 MHz, and 1900 MHz (e.g., the main Global System for Mobile Communications or GSM cellular telephone bands). Long-range wireless communications circuitry may also handle the 2100 MHz band.

Electronic devices may use short-range wireless communications links to handle communications with nearby equipment. For example, electronic devices may communicate using the WiFi® (IEEE 802.11) bands at 2.4 GHz and 5 GHz and the Bluetooth® band at 2.4 GHz. It is sometimes desirable to receive satellite navigation system signals such as signals from the Global Positioning System (e.g., to receive GPS signals at 1575 MHz).

Figure 1:
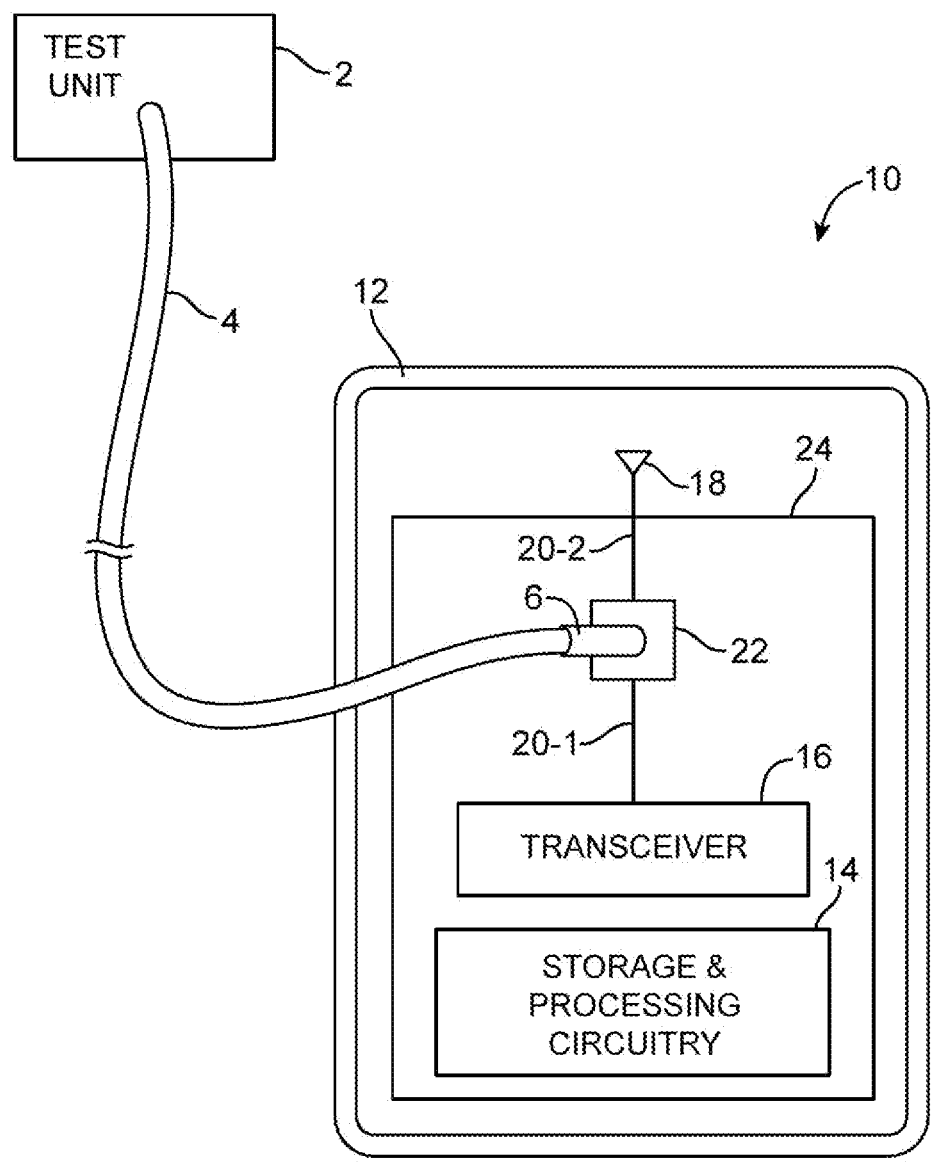
FIG. 1 is a diagram of an illustrative electronic device under test in accordance with an embodiment of the present invention.

FIG. 1 is a diagram of an exemplary wireless electronic device. As shown in FIG. 1, device 10 may have a device housing such as housing structure 12 that forms a case for its associated components. Housing 12 may be formed from plastic, glass, ceramics, fiber composites, metal (e.g., stainless steel, aluminum, etc.), other suitable materials, or a combination of these materials. In some situations, parts of housing 12 may be formed from dielectric or other low-conductivity material. In other situations, housing 12 or at least some of the structures that make up housing 12 may be formed from conductive elements (e.g., a conductive peripheral bezel member).

Device 10 may include within its housing at least one antenna 18, radio-frequency (RF) transceiver circuitry 16, storage and processing circuitry 14, input-output devices, and other electronic components. Transceiver 16 may be coupled to antenna 18 through a switch connector such as radio-frequency switch connector 22. Storage and processing circuitry 14, transceiver circuitry 16, and switch connector 22 may be mounted on a substrate such as printed circuit board (PCB) 24. Circuit board 24 may be, for example, a rigid printed circuit board formed from fiberglass-filled epoxy (e.g., FR-4) or may be a flexible printed circuit ("flex circuit")

formed from a sheet of polymer such as a polyimide sheet. Printed circuit board 24 may, if desired, be mounted to housing structure 12.

Storage and processing circuitry 14 may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in storage and processing circuitry 14 may be used to control the operation of device 10. This processing circuitry may be based on one or more microprocessors, microcontrollers, digital signal processors, baseband processors, power management units, audio codec chips, application specific integrated circuits, etc.

Storage and processing circuitry 14 may be used to run software on device 10, such as internet browsing applications, voice-over-internet-protocol (VoIP) telephone call applications, email applications, media playback applications, operating system functions, etc. To support interactions with external equipment, storage and processing circuitry 14 may be used in implementing communications protocols. Communications protocols that may be implemented using circuitry 14 include internet protocols, wireless local area network protocols (e.g., IEEE 802.11 protocols—sometimes referred to as WiFi®), protocols for other short-range wireless communications links such as the Bluetooth® protocol, cellular telephone protocols, etc.

Transceiver (sometimes referred to as a radio circuit) 16 may include satellite navigation system receiver circuitry for receiving satellite positioning signals at 1575 MHz, wireless local area network (WLAN) circuitry for handling the 2.4 GHz and 5 GHz WiFi® (IEEE 802.11) communications bands and the 2.4 GHz Bluetooth® communications band, cellular telephone circuitry for handling telephone bands such as bands at 850 MHz, 900 MHz, 1800 MHz, and 1900 MHz, and other types of transceiver circuitry.

Antenna 18 may include antenna resonating element conductive structures. Antenna 18 may be a loop antenna, inverted-F antenna, strip antenna, planar inverted-F antenna, slot antenna, hybrid antenna that includes antenna structures of more than one type, or other suitable types of antennas. The antenna resonating element conductive structures may, if desired, be formed from portions of housing structure 12. The antenna resonating element conductive structures may also include patterned metal traces formed on a substrate such as a plastic support structure, a rigid printed circuit board, or a flex circuit.

Transceiver 16 may be coupled to antenna 18 through a transmission line path. Switch connector 22 may be interposed between transceiver 16 and antenna 18 in the transmission line path. For example, the transmission line path may include a first transmission line path portion 20-1 and a second transmission line path portion 20-2. Path 20-1 may be coupled between switch connector 22 and transceiver 16, whereas path 20-2 may be coupled between switch connector 22 and antenna 18. The transmission line path may include conductive traces (e.g., microstrip transmission lines, stripline transmission lines, edge coupled microstrip or stripline transmission lines, etc.) formed on printed circuit board 24, one or more segments of coaxial cable, and other suitable conduits through which radio-frequency signals may be conveyed between transceiver 16 and antenna 18.

The wireless communications circuitry within housing 12 may be tested and calibrated during production of device 10. The components being tested may sometimes be referred to as device structures under test. Device structures under test may include transceiver circuitry 16, antenna 18, switch connector 22, and other wireless communications circuitry. These device structures under test may or may not be assembled within housing 12 during test operations.

During testing, at least one of transceiver 16 and antenna 18 may be coupled to test equipment for conducted (wired) radio-frequency testing. For example, transceiver 16 may be coupled to the test equipment to conduct transceiver testing, and antenna 18 may be coupled to the test equipment to conduct antenna testing. Transceiver testing and antenna testing may be conducted in parallel, if desired. Test equipment may include, for example, test unit 2 that can be used to perform desired radio-frequency performance measurements on the device structures under test, a test probe 6 that can be used to mate with switch connector 22, and radio-frequency cable 4 (e.g., a coaxial cable) that connects test probe 6 to test unit 2. Cable 4 may, for example, include an inner signal conductor surrounded by a tubular ground shielding layer, where the signal conductor and the ground shielding layer are separated by dielectric insulating material.

When test probe 6 is mated with switch connector 22, antenna 18 may be decoupled from transceiver 16. In one test configuration, radio-frequency test signals can be conveyed between transceiver 16 and test unit 2 using probe 6 (i.e., to conduct transceiver testing). In a second test configuration, radio-frequency test signals can be conveyed between antenna 18 and test unit 2 using probe 6 (i.e., to conduct antenna testing). Transceiver testing and antenna testing may be conducted simultaneously, if desired.

Test unit 2 may include a signal generator that generates radio-frequency test signals over a range of frequencies. These test signals may be provided to test probe 6 over radio-frequency cable 4. Test unit 2 may also include a receiver that is capable of measuring wireless performance information for incoming signals (i.e., radio-frequency signals that are received by test probe 6 from transceiver 16 or antenna 18).

With one suitable arrangement, test unit 2 may be a vector network analyzer (VNA) and a computer that is coupled to the vector network analyzer for gathering and processing test results. Tester 2 may, for example, be the CMU300 Universal Radio Communication Tester available from Rohde & Schwarz. This is, however, merely illustrative. Test unit 2 may be a radio communications tester of the type that is used to perform radio-frequency signaling tests for a variety of different radio-frequency communications bands and channels (e.g., test unit 2 may be a spectrum analyzer, a power meter, a wireless protocol tester, etc.).

Figure 2:
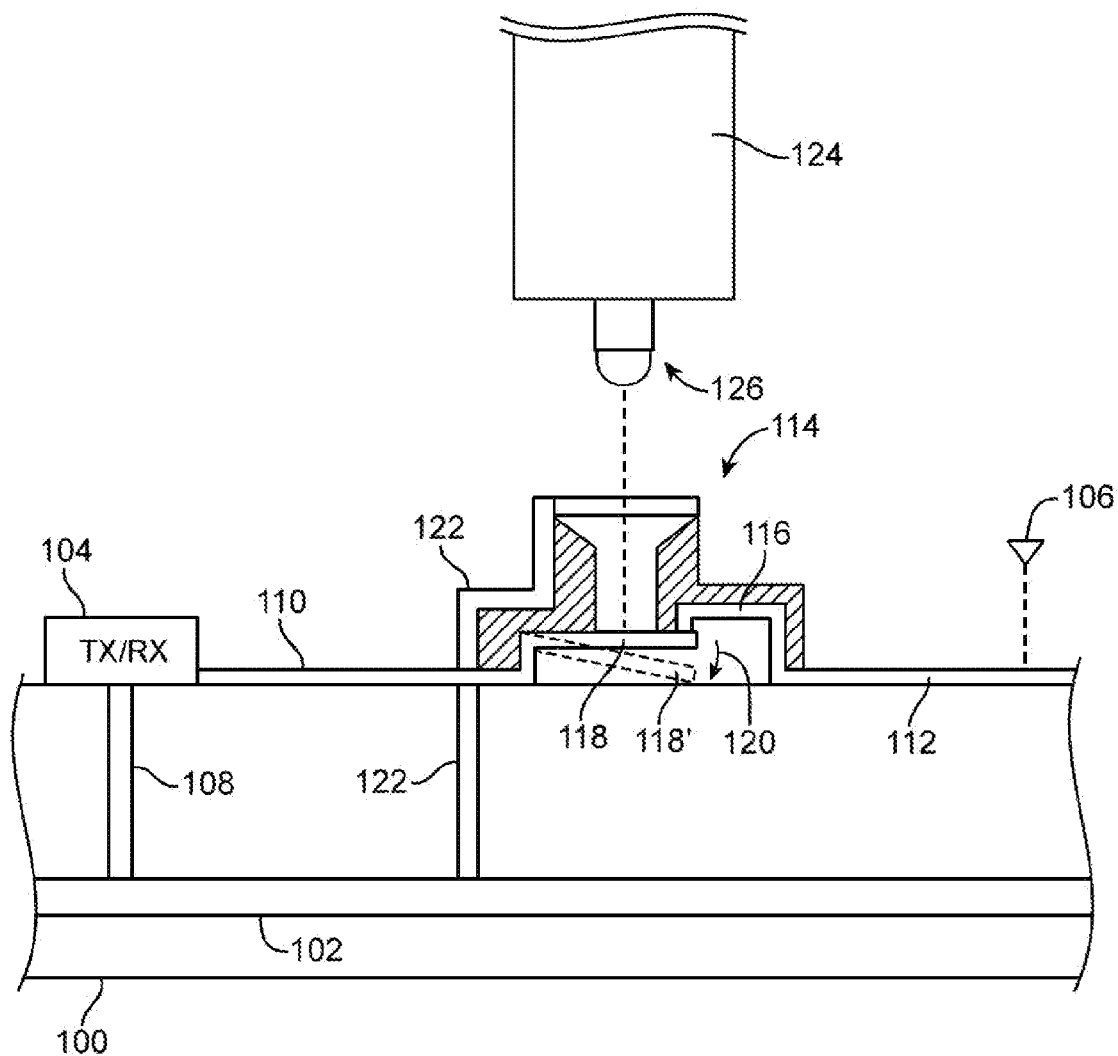
FIG. 2 is a cross-sectional side view of a conventional switch connector.

FIG. 2 is a diagram of a conventional switch connector. As shown in FIG. 2, conventional switch connector 114 is interposed in the transmission line path between transceiver 104 and antenna 106. Transceiver 104 and switch connector 114 are mounted on printed circuit board 100. Ground path 102 is formed in printed circuit board 100. Transceiver 104 is grounded through via 108.

Switch connector 114 contains a movable metal terminal such as movable terminal 118 and a fixed metal terminal such as fixed terminal 116. Switch connector 114 is grounded through via 122. Movable terminal 118 is connected to transmission line segment 110 (i.e., the transmission line segment connecting transceiver 104 to switch connector 114), whereas fixed terminal 116 is connected to transmission line segment 112 (i.e., the transmission line segment connecting antenna 106 to switch connector 114). When switch connector 114 is in the unmated state, movable terminal 118 makes physical contact with fixed terminal 116 to electrically connect transceiver 104 to antenna 106.

Coaxial test probe 124 can be used to mate with switch connector 114. Test probe 124 includes a test pin 126. When test probe 124 is mated with switch connector 114, test pin 126 makes contact with and displaces movable terminal 118 to a new position 118' in the direction as indicated by arrow 120 (i.e., movable terminal 118 is temporarily disconnected from fixed terminal 116). Decoupling transceiver 104 from antenna 106 in this way allows for transceiver testing but not antenna testing. Conventional switch connector 114 may therefore sometimes be referred to as a "unidirectional" switch connector.

Figure 3:
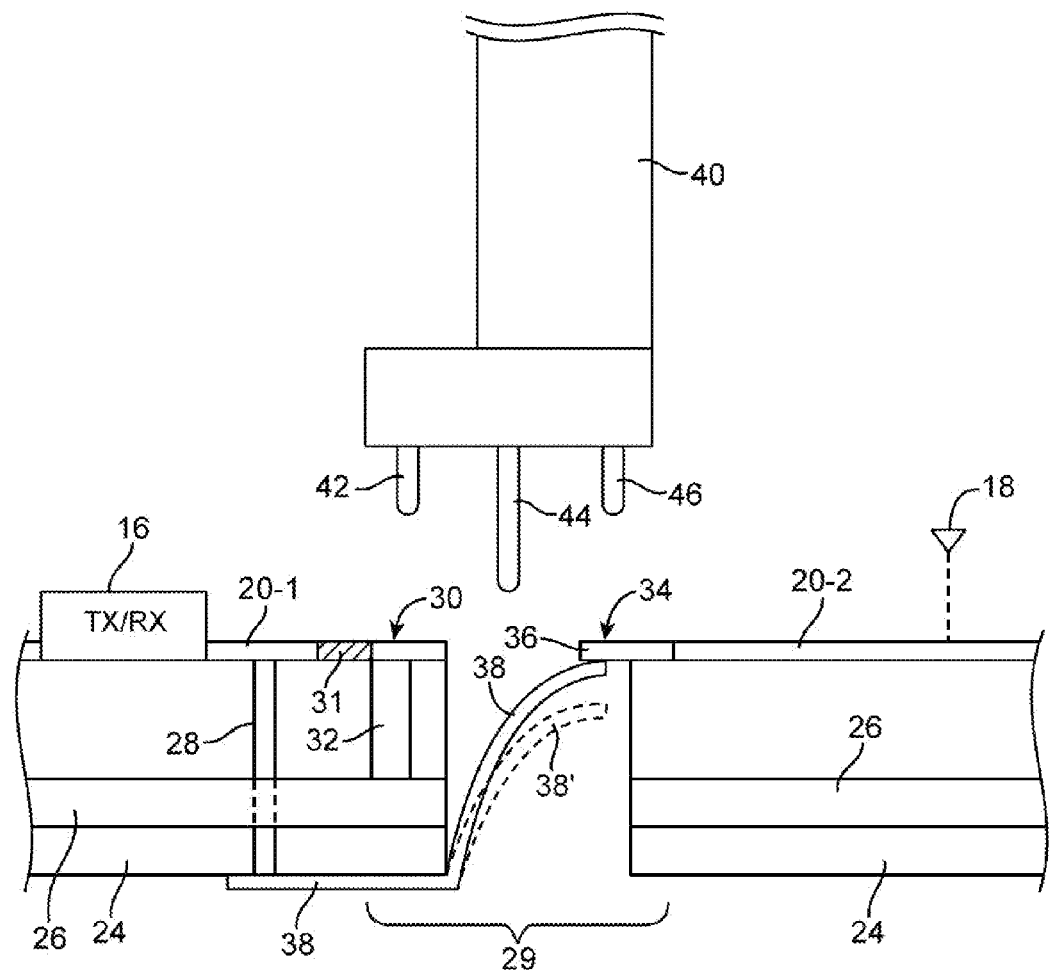
FIG. 3 is a cross-sectional side view of an illustrative switch connector that is embedded in a substrate in accordance with an embodiment of the present invention.

It may be desirable to provide a "bidirectional" switch connector that supports transceiver testing and antenna testing. FIG. 3 shows one suitable arrangement in which a bidirectional switch connector is embedded (integrated) in PCB 24. Board 24 may have a top surface, a bottom surface, and a ground path 26 formed in at least one of its layers. As shown in FIG. 3, switch connector 29 may include a ground test pad 30, a conductive protruding member 34, and a conductive spring member 38. Conductive spring member 38 may be formed using metals such as copper, brass, silver, gold, and other suitable conductive materials. Transceiver 16, transmission line portions 20-1 and 20-2, ground pad 30, and protruding member 34 may be formed on the top surface of PCB 24, whereas spring member 38 may be attached to the bottom surface of PCB 24 and may extend from the bottom surface of PCB 24 to the top surface of PCB 24 (as an example). Ground pad 30 and transmission line portion 20-1 may be isolated by dielectric material 31.

Spring member 38 may be coupled to path 20-1 through via 28, whereas ground pad 30 may be coupled to ground path 26 through via 32. Protruding member 34 may be coupled to transmission line portion 20-2. When switch connector 29 is in the unmated state, spring member 38 may be in physical contact with protruding member 34 (e.g., spring member 38 may press up against a portion 36 of protruding member 34), and switch connector 29 may serve to electrically coupled transceiver 16 to antenna 18.

A test probe such as test probe 40 may be used to mate with switch connector 29. Test probe 40 may include pins (sometimes referred to as probe pins) 42, 44, and 46. At least one of the test probe pins may be spring-loaded to provide improved mate-ability for test probe 40 during test operations. When test probe 40 is mated with switch connector 29, ground pin 42 may contact ground pad 30, test pin 46 may contact protruding member 34, and test pin 44 may contact and push down on spring member 38, causing spring member 38 to bend to a new position 38' (e.g., spring member 38 may be temporarily disconnected from protruding member 34). Decoupling transceiver 16 from antenna 18 using this approach may allow for transceiver testing and/or antenna testing.

In one suitable arrangement, pin 44 may be a conductive signal pin, whereas pin 46 may be a nonconductive (or dummy) pin. Test probe 40 of this type may be used to perform transceiver testing by conveying radio-frequency test signals between transceiver 16 and test unit 2 through signal and ground pins 44 and 42. If desired, pin 46 need not be present in this example.

In another suitable arrangement, pin 44 may be a nonconductive dummy pin, whereas pin 46 may be a conductive signal pin. Test probe 40 of this type may be used to perform antenna testing by conveying radio-frequency test signals between antenna 18 and test unit 2 through signal and ground pins 46 and 42. If desired, pin 44 may also be a ground pin.

In another suitable arrangement, pins 44 and 46 may both be conductive signal pins. Test probe 40 of this type may be used to perform transceiver testing and antenna testing in parallel by conveying a first set of radio-frequency test signals between transceiver 16 and test unit 2 using signal pin 44 and by conveying a second set of radio-frequency test signals between antenna 18 and test unit 2 using signal pin 46.

Figure 4:
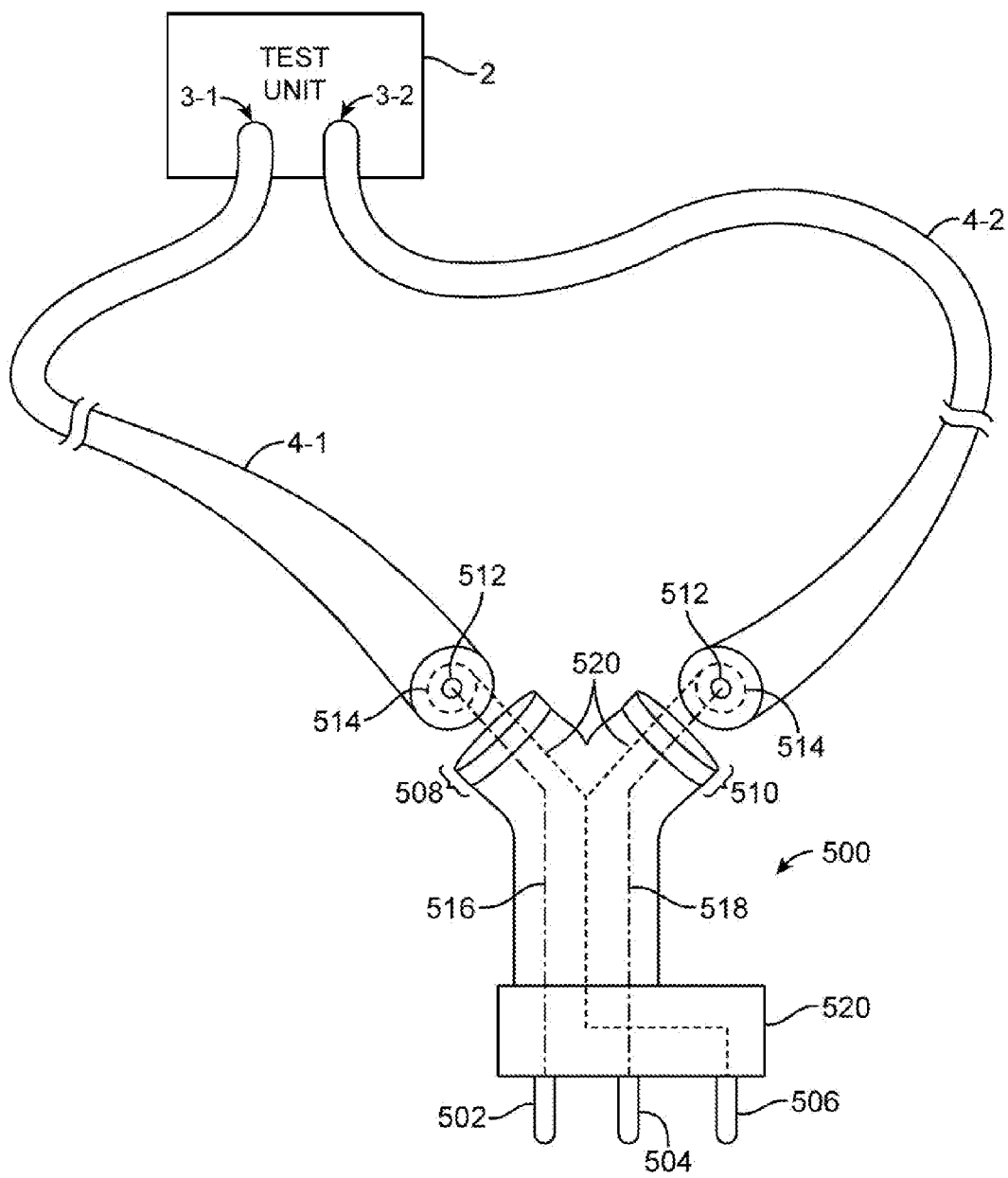
FIG. 4 is a diagram of an illustrative test probe having two signal pins in accordance with an embodiment of the present invention.

A test probe having two signal pins may include at least two cable connector terminals. As shown in FIG. 4, test probe 500 may include first signal pin 502, second signal pin 504, ground pin 506, first cable connector terminal 508, and second cable connector terminal 510. A first radio-frequency cable 4-1 may have a first end that is connected to a first test port 3-1 in test unit 2 and a second end that can be mated with first cable connector terminal 508. A second radio-frequency cable 4-2 may have a first end that is connected to a second test port 3-2 in test unit 2 and a second end that that can be mated with second cable connector terminal 510.

When cable 4-1 is mated with connector 508, inner signal conductor 512 of cable 4-1 may be electrically connected to first signal pin 502, as indicated by line 516. When cable 4-2 is mated with connector 510, inner signal conductor 512 of cable 4-2 may be electrically connected to second signal pin 504, as indicated by line 518. The ground shielding conductor 514 of cables 4-1 and 4-2 may be electrically connected to ground pin 506, as indicated by line 520. Test probes of this type may be used to support bidirectional testing of multiple wireless circuitry in parallel.

For example, test unit 2 may be used to perform radio-frequency test measurements on the transceiver and the antenna in parallel by transmitting and receiving test signals through test ports 3-1 and 3-2, respectively. The transmitted and received test signals may be processed to compute complex impedance data (sometimes referred to as S11 parameter data), complex forward transfer coefficient data (sometimes referred to as S21 data), or other suitable data for determining whether the wireless circuitry satisfy design criteria. If desired, test unit 2 may include one test port or more than two test ports to support simultaneously radio-frequency testing for any number of wireless communications circuitry.

Figure 5A:
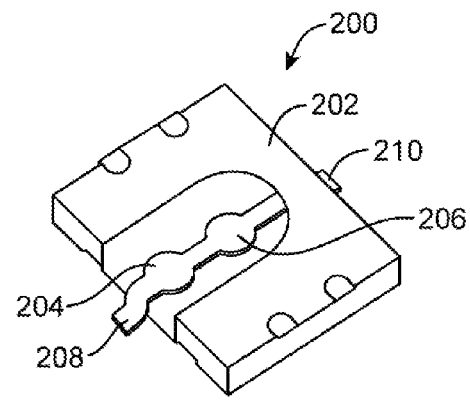
FIG. 5A is a perspective view of an illustrative switch connector with two test pads in accordance with an embodiment of the present invention.
Figure 5B:
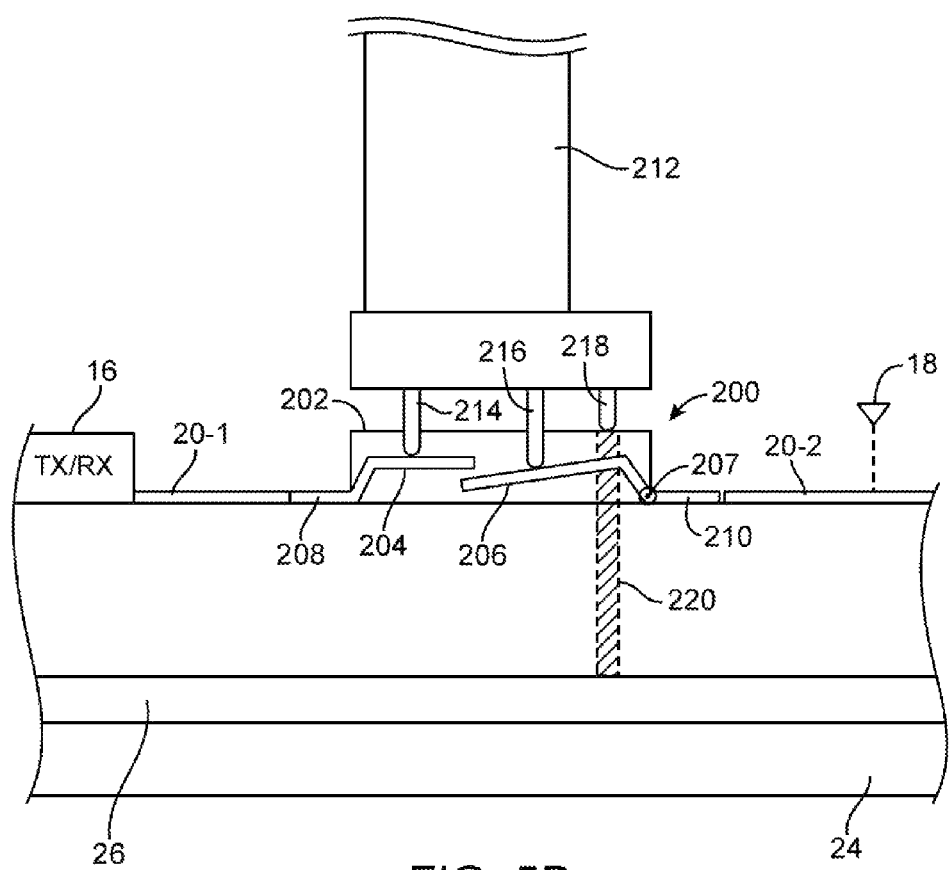
FIG. 5B is a cross-sectional side view of the switch connector of FIG. 5A in the mated state in accordance with an embodiment of the present invention.

FIGS. 5A and 5B show another suitable configuration for the bidirectional switch connector. As shown in the perspective view in FIG. 5A, bidirectional switch connector 200 may include first conductive landing member 204 and a second conductive landing member 206 encased within metal housing 202. Landing member 204 may include protruding mounting member 208, whereas landing member 206 may include protruding mounting member 210. Landing member 206 may be movable (bendable), whereas landing member 208 is fixed within housing 202. Landing members 204 and 206 (sometimes referred to as test pad structures) may be formed using flexible metal plates, sheets, or other conductive structures.

FIG. 5B shows a cross-sectional side view of switch connector 200 mated with a corresponding test probe 212. As shown in FIG. 5B, switch connector 200 may be mounted on the top surface of PCB 24. Switch connector housing 202 may be coupled to ground through path 220. Protruding mounting member 208 may be coupled to transceiver 16 through transmission line path portion 20-1, whereas protruding mounting member 210 may be coupled to antenna 18 through transmission line path portion 20-2. If desired, switch connector 200 may be embedded in PCB 24 (see, e.g., FIG. 3).

Test probe 212 may include test pins 214, 216, and 218. When test probe 212 is mated with switch connector 200, pin 218 (e.g., a ground pin) may make contact with connector housing 202, pin 214 may make contact with fixed landing member 204, and pin 216 may make contact with movable landing member 206 to cause member 206 to bend downwards about hinge axis 207 so that member 206 is decoupled from member 204. Hinge axis 207 may, as an example, be parallel to the surface of PCB 24 and perpendicular to transmission line portion 20-1.

At least one of test pins 214, 216, and 218 may be spring-loaded. At least one of test pins 214 and 216 may be a conductive signal pin. For example, test probe 212 having conductive signal pin 214 and nonconductive pin 216 may be used during transceiver testing. As another example, test probe 212 having nonconductive pin 214 and conductive signal pin 216 may be used during antenna testing. As another example, test probe 212 having first conductive signal pin 214 and second conductive signal pin 216 may be used during simultaneous transceiver and antenna testing.

Figure 6A:
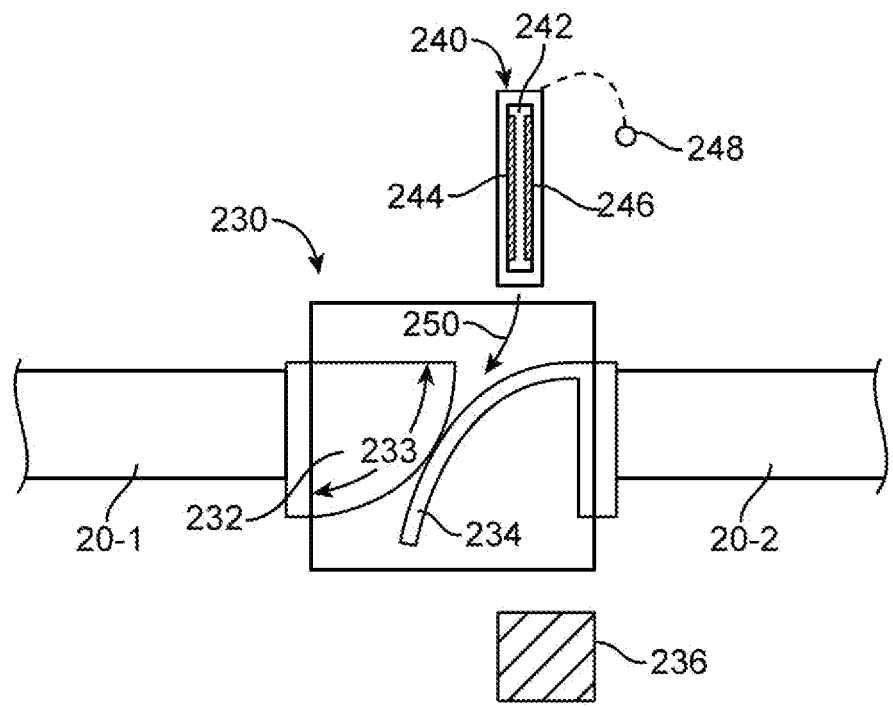
FIG. 6A is a top view of an illustrative switch connector having a rigid conductive member and a flexible conductive member in accordance with an embodiment of the present invention.
Figure 6B:
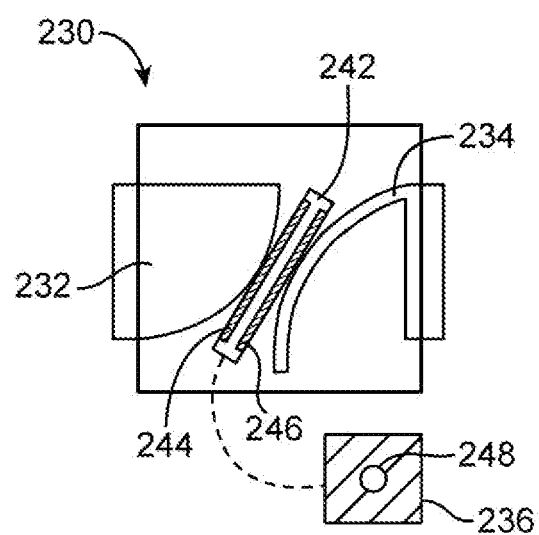
FIG. 6B is a top view of the switch connector of FIG. 6A in the mated state in accordance with an embodiment of the present invention.

FIGS. 6A and 6B show another suitable configuration for the bidirectional switch connector. FIG. 6A shows a top view of an exemplary switch connector 230 having a rigid (fixed) conductive member 232 and a conductive spring member 234. Switch connector 230 may be mounted on the top surface of the PCB or may be integrated in the PCB. Rigid member 232 may be shorted with path 20-1, whereas spring member 234 may be shorted with path 20-2. An associated ground pad 236 may be formed adjacent to switch connector 230 on the top surface of the PCB. When switch connector 230 is in the unmated state, spring member 234 may bear against a curved portion 233 of rigid member 232.

A test probe such as test probe 240 may be used to mate with switch connector 230. Test probe 240 may include a grounding pin 248 and a probe head member (sometimes referred to as a blade member) 242 having a tip. Blade member 242 may have a first conductive signal pad 244 on one side of its tip and a second conductive signal pad 246 on the other side of its tip. The first and second conductive signal pads are isolated by dielectric material similar to that of the PCB (as an example). During testing, test probe 240 may mate with switch connector 230 by wedging blade member 242 in a notch between rigid member 232 and spring member 234 (e.g., in a lateral direction along the surface of the substrate as indicated by arrow 250) to push spring member 234 away from rigid member 232.

FIG. 6B shows a top view of switch connector 230 in the mated state. As shown in FIG. 6B, signal pad 244 may make physical contact with rigid member 232, signal pad 246 may make physical contact with spring member 234, and ground pin 248 may make physical contact with ground pad 236. Test probe 240 may be a test probe of the type described in connection with FIG. 4. If desired, test pad 246 need not be used during transceiver testing (e.g., test pad 246 may not be present). If desired, test pad 244 need not be used during antenna testing (e.g., test pad 244 may not be present).

Figure 7A:
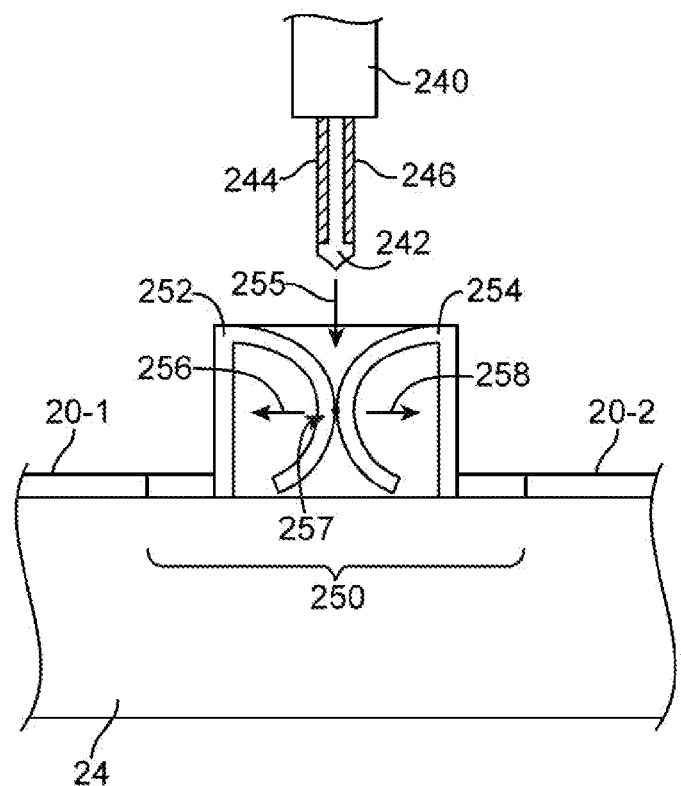
FIG. 7A is a cross-sectional side view of an illustrative switch connector having two flexible conductive members, where the switch connector is mounted on a substrate in accordance with an embodiment of the present invention.
Figure 7B:
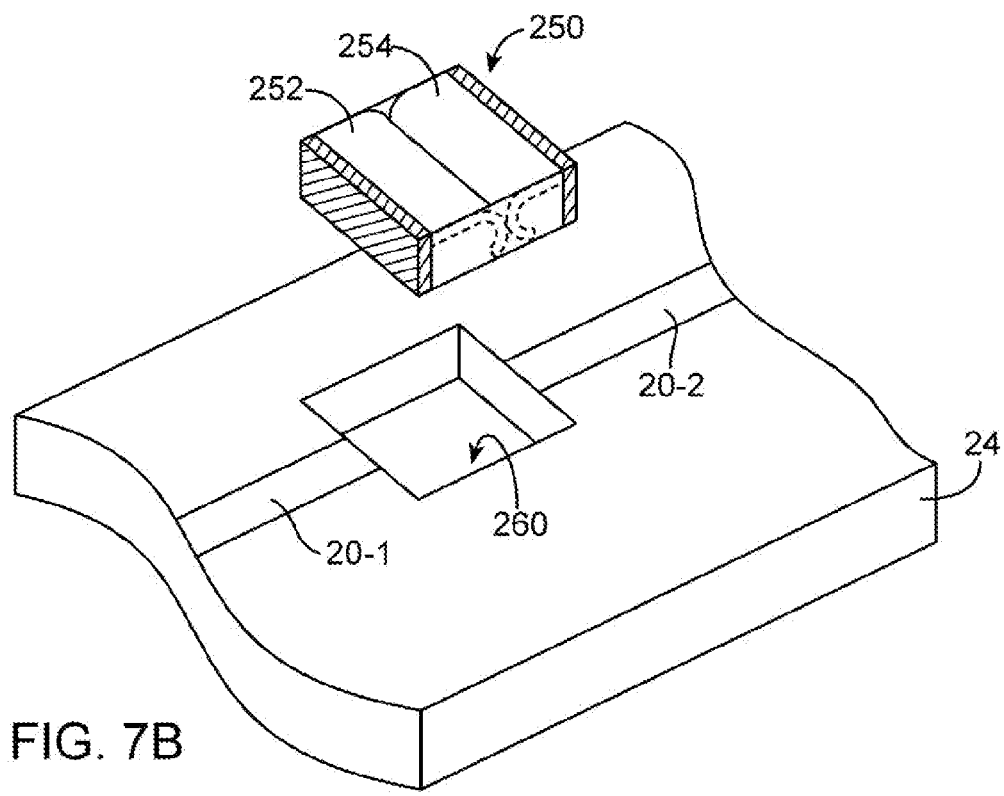
FIG. 7B is a perspective view of the switch connector of the type shown in connection with FIG. 7A, where the switch connector is embedded in a slot within the substrate in accordance with an embodiment of the present invention.

FIGS. 7A and 7B show another suitable configuration for the bidirectional switch connector. FIG. 7A shows a cross-sectional view of an exemplary switch connector 250 having a first conductive flexible member 252 and a second conductive flexible member 254. Flexible members 252 and 254 may be formed using flexible conductive sheets or springs. Switch connector 250 may be mounted on the top surface of the PCB (as shown in FIG. 7A) or may be embedded in the PCB by inserting connector 230 (e.g., a removable switch component) in a corresponding slot 260 within the PCB (as shown in FIG. 7B). First flexible member 252 may be shorted with path 20-1, whereas second flexible member 254 may be shorted with path 20-2. When switch connector 250 is in the unmated state, flexible members 252 and 254 may press against each other at contact point 257.

Test probe 240 of the type described in connection with FIGS. 6A and 6B may be used to mate with switch connector 250. During testing, test probe 240 may mate with switch connector 250 by wedging blade member 242 in a notch between flexible members 252 and 254 (e.g., inserted from above switch connector 250 as indicated by the direction of arrow 255) to push members 252 and 254 away from each other in the direction of arrows 256 and 258. For clarity, the ground path associated with test probe 240 is not shown.

Figure 8A:
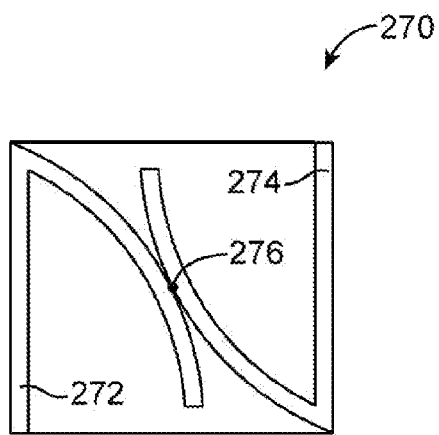
FIG. 8A is a top view of an illustrative switch connector having two conductive spring members in accordance with an embodiment of the present invention.
Figure 8B:
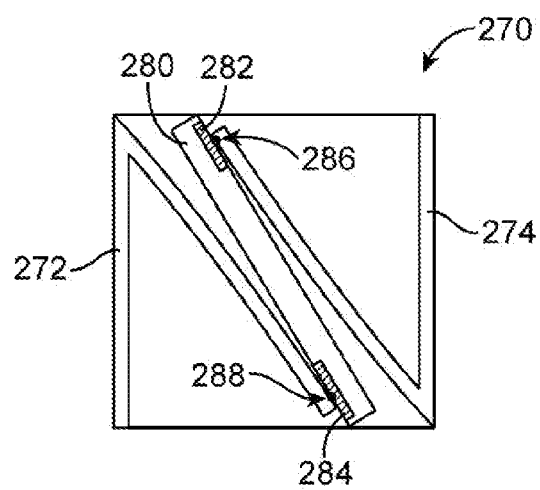
FIG. 8B is a top view of the switch connector of FIG. 8A in the mated state in accordance with an embodiment of the present invention.

FIGS. 8A and 8B show another suitable configuration for the bidirectional switch connector. FIG. 8A shows a top view of an exemplary switch connector 270 having a first conductive spring member 272 and a second conductive spring member 274. Switch connector 270 may be mounted on the top surface of the PCB or may be integrated in the PCB. Spring member 272 may be shorted with path 20-1, whereas spring member 274 may be shorted with path 20-2. When switch connector 270 is in the unmated state, spring members 272 and 274 may bear against each other at contact point 276.

Figure 8C:
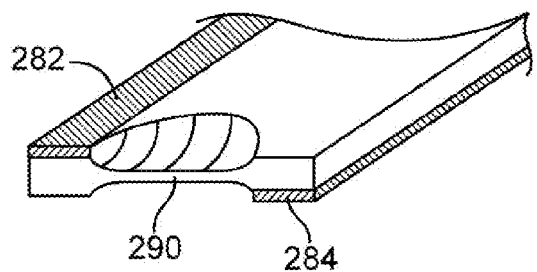
FIG. 8C is a diagram of an illustrative test probe having two signal paths that can be used to mate with the switch connector of FIG. 8A in accordance with an embodiment of the present invention.

The test probe that may be used to mate with switch connector 270 may include a blade member 280. Blade member 280 may have a first exposed conductive signal path 282 on one side and a second exposed conductive signal path 284 on the other side (see, e.g., FIG. 8C). The first and second conductive signal paths are isolated by dielectric material similar to that of the PCB (as an example). As shown in FIG. 8C, signal paths 282 and 284 may be formed at non-adjacent edges along blade member 280 (e.g., at diagonally opposing corners). Blade member 280 may also have a flat tapered tip portion 290 to help blade member 280 wedge between spring members 272 and 274 when the test probe is inserted from above switch connector 270. If desired, blade member 280 may also be inserted laterally along the surface of the PCB to separate spring members 272 and 274.

FIG. 8B shows a top view of switch connector 270 in the mated state. As shown in FIG. 8B, signal path 284 may make physical contact with spring member 272 at point 288, whereas signal path 282 may make physical contact with spring member 274 at point 286. Blade member 280 may be part of a test probe of the type described in connection with FIG. 4. If desired, test path 282 need not be used during transceiver testing (e.g., test path 282 may not be present). If desired, test path 284 need not be used during antenna testing (e.g., test path 284 may not be present).

Figure 9A:
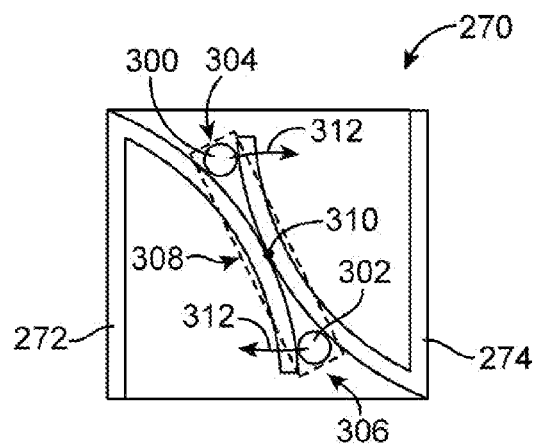
FIG. 9A is a top view of an illustrative switch connector having two conductive spring members in accordance with an embodiment of the present invention.

A rotatable test probe such as rotatable test probe 308 may also be used to mate with bidirectional switch connector 270. As shown in the top view of FIG. 9A, test probe 308 may include a first test pin 300 and a second test pin 302. In the unmated state, switch connector 270 may have a first notch 304 and a second notch 306 formed between spring members 272 and 274. When test probe 308 is engaged with switch connector 270, first test pin 300 may be inserted in the first notch, whereas second test pin 302 may be inserted in the second notch. Test probe 308 may then be rotated about rotational axis 310 so that pins 300 and 302 are rotated in a clockwise direction as indicated by arrow 312.

Figure 9B:
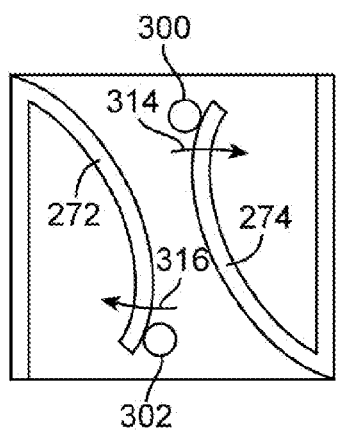
FIG. 9B is a top view of the switch connector of FIG. 9A in the mated state in accordance with an embodiment of the present invention.

FIG. 9B shows the switch connector 270 when test probe 308 has been rotated. As shown in FIG. 9B, pin 300 may bear against spring member 274 to cause spring member 274 to bend in the direction of arrow 314, whereas pin 302 may bear against spring member 272 to cause spring member 272 to bend in the direction of arrow 316. Decoupling spring members 272 and 274 in this way may allow for bidirectional probing.

Figure 9C:
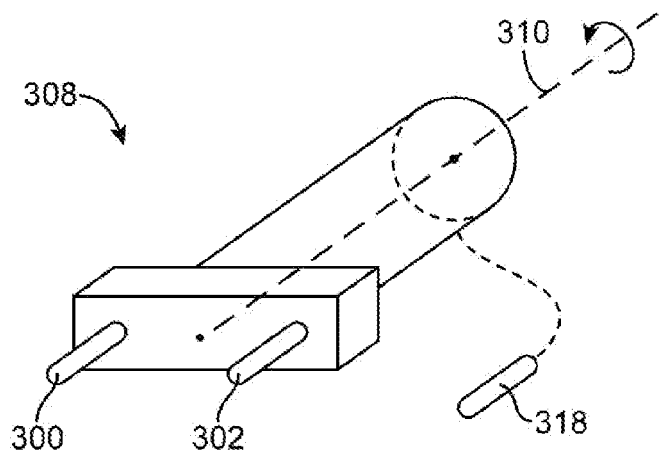
FIG. 9C is a diagram of an illustrative rotatable test probe having two signal pins that may be used with the switch connector of FIG. 9A in accordance with an embodiment of the present invention.

A perspective view of test probe 308 is shown in FIG. 9C. As shown in FIG. 9C, test probe 308 may be rotated about longitudinal axis 310. An associated ground pin 318 may also be coupled to test probe 308 for making contact with a corresponding ground pad on the PCB. At least one of test pins 300 and 302 may be a conductive signal pin. For example, test probe 308 having conductive signal pin 302 and nonconductive pin 300 may be used during transceiver testing. As another example, test probe 308 having nonconductive pin 302 and conductive signal pin 300 may be used for during antenna testing. As another example, test probe 308 having first conductive signal pin 300 and second conductive signal pin 302 may be used during simultaneous transceiver and antenna testing (e.g., test probe 308 may be a test probe of the type described in connection with FIG. 4).

Figure 10A:
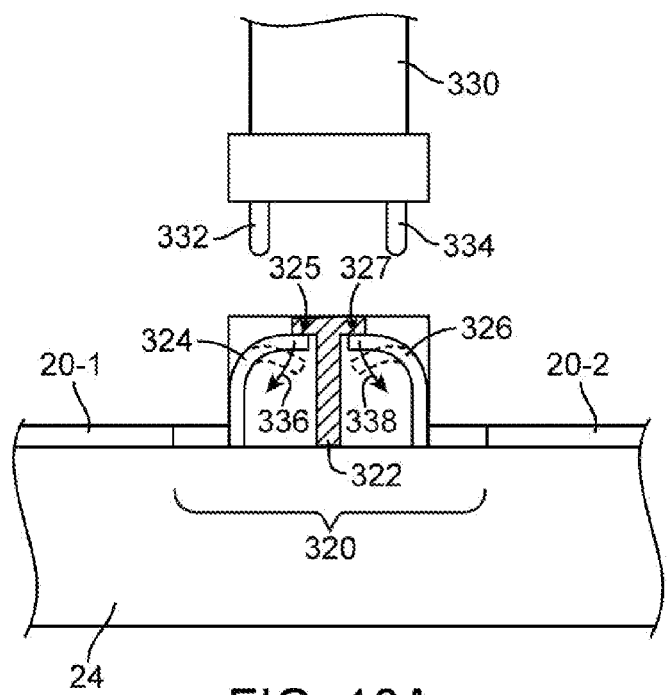
FIG. 10A is a cross-sectional side view of an illustrative switch connector having two conductive spring members pushing up against a conductive shorting beam in accordance with an embodiment of the present invention.

FIG. 10A shows another suitable configuration for the bidirectional switch connector. As shown in the cross-sectional side view of FIG. 10A, switch connector 320 may include a first conductive spring member 324, a second conductive spring member 326, and a rigid conductive shorting member 322 (e.g., a T-shaped beam member). First spring member 324 may be coupled to the transceiver through path 20-1, whereas second spring member 326 may be coupled to the antenna through path 20-2. Switch connector 320 may be mounted on the top surface of PCB 24 (as shown in FIG. 10A) or may be embedded within PCB 24.

When switch connector 320 is in the unmated state, first spring member 324 my press up against a first protruding portion 325 of rigid member 322, whereas second spring member 326 may press up against a second protruding portion 327 of rigid member 322. When conductive spring members 324 and 326 are both in physical contact with rigid shorting member 322, radio-frequency signals may be conveyed between the transceiver and the antenna through switch connector 320.

Figure 10B:
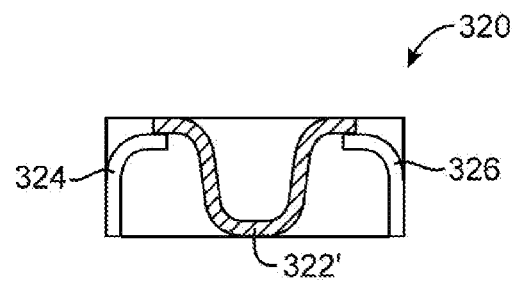
FIG. 10B is a cross-sectional side view of an illustrative switch connector having two conductive spring members pushing up against a flexible conductive sheet in accordance with an embodiment of the present invention.

A test probe such as test probe 330 may be used to mate with switch connector 320. Test probe 330 may have first and second test pins 332 and 334. When test probe 330 is mated with switch connector 320, pin 332 may push down against spring member 324 to cause spring member 324 to flex downwards in the direction of arrow 336, whereas pin 334 may push down against spring member 326 to cause spring member 326 to flex downwards in the direction of arrow 338 (e.g., so that spring members 324 and 326 are temporarily disconnected from rigid shorting member 322. If desired, shorting member 322 may be formed using a conductive sheet 322' (see, e.g., FIG. 10B).

Figure 10C:
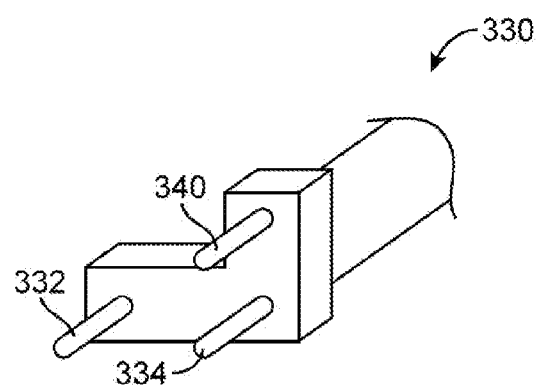
FIG. 10C is a diagram of an illustrative test probe having two signal pins that may be used with the switch connectors of FIGS. 10A and 10B in accordance with an embodiment of the present invention.

FIG. 10C shows a perspective view of test probe 330. Test probe 330 may include a grounding pin 340 that can be used to mate with a corresponding ground pad formed on the surface of PCB 24. Test probe 330 need not include both test pins 332 and 334. For example, test probe 330 having conductive signal pin 332 and lacking pin 334 (or having a nonconductive dummy pin 334) may be used during transceiver testing. As another example, test probe 330 having conductive signal pin 334 and lacking pin 332 (or having a nonconductive dummy pin 332) may be used during antenna testing. As another example, test probe 330 having both conductive signal pins 332 and 334 may be used during simultaneous transceiver and antenna testing (e.g., test probe 330 may be a test probe of the type described in connection with FIG. 4).

Figure 11A:
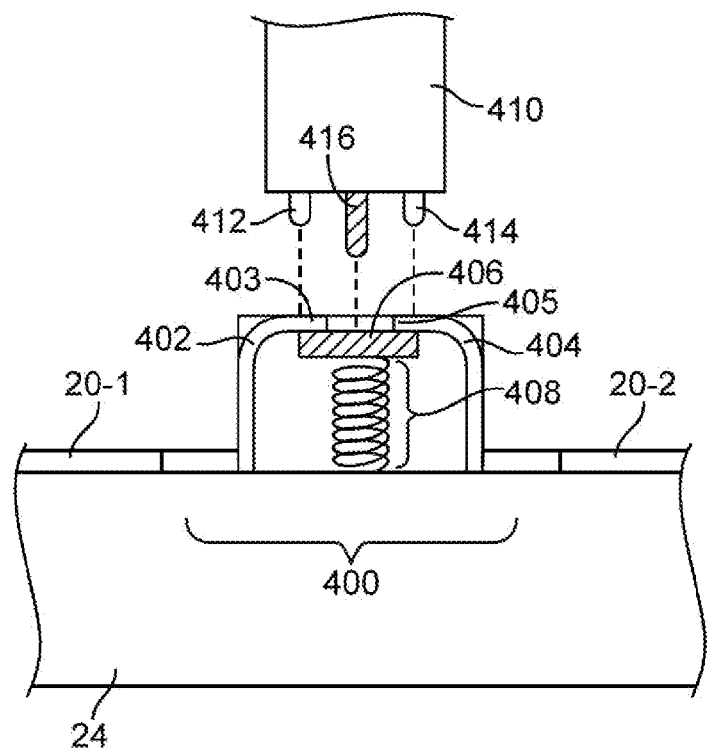
FIG. 11A is a cross-sectional side view of an illustrative switch connector having a spring-loaded conductive shorting member pushing up against two conductive spring members in accordance with an embodiment of the present invention.

FIG. 11A shows another suitable configuration for the bidirectional switch connector. As shown in the cross-sectional side view of FIG. 11A, switch connector 400 may include a first conductive spring member 402, a second conductive spring member 404, and a spring-loaded shorting member 406. First spring member 402 may be coupled to the transceiver through path 20-1, whereas second spring member 404 may be coupled to the antenna through path 20-2. Switch connector 400 may be mounted on the top surface of PCB 24 (as shown in FIG. 11A) or may be embedded within PCB 24.

When switch connector 400 is in the unmated state, spring-loaded shorting member 406 may press up against a tip portion 403 of spring member 402 and a tip portion 405 of spring member 404 (e.g., a spring member 408 interposed between shorting member 406 and PCB 24 may serve to push member 406 upwards so that spring members 402 and 404 are connected through member 406). When conductive spring members 402 and 404 are both in physical contact with shorting member 406, radio-frequency signals may be conveyed between the transceiver and the antenna through switch connector 400.

Figure 11B:
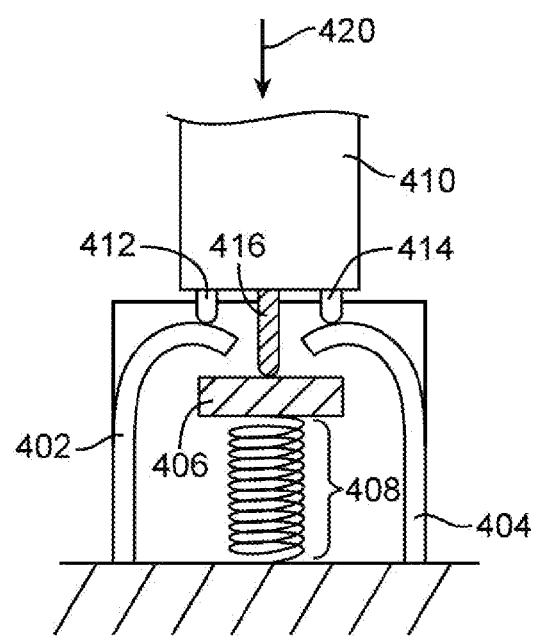
FIG. 11B is a cross-sectional side view of the switch connector of FIG. 11A in the mated state in accordance with an embodiment of the present invention.

A test probe such as test probe 410 may be used to mate with switch connector 400. Test probe 410 may have a first test pin 412, a second test pin 414, and a nonconductive pin 416. When test probe 410 is mated with switch connector 400, nonconductive pin 416 may push down against shorting member 406 in the direction of arrow 420 (to compress spring member 408) so that shorting member 406 is temporarily disconnected from spring members 402 and 404 (see, e.g., FIG. 11B). In this mated state, test pin 412 may be electrically connected to spring member 402, whereas test pin 404 may be electrically connected to spring member 404.

Test probe 410 need not include both test pins 412 and 414. For example, test probe 410 having conductive signal pin 412 and lacking pin 414 (or having a nonconductive dummy pin 414) may be used during transceiver testing. As another example, test probe 410 having conductive signal pin 414 and lacking pin 412 (or having a nonconductive dummy pin 412) may be used during antenna testing. As another example, test probe 410 having both conductive signal pins 412 and 414 may be used during simultaneous transceiver and antenna testing (e.g., test probe 410 may be a test probe of the type described in connection with FIG. 4).

Figure 12A:
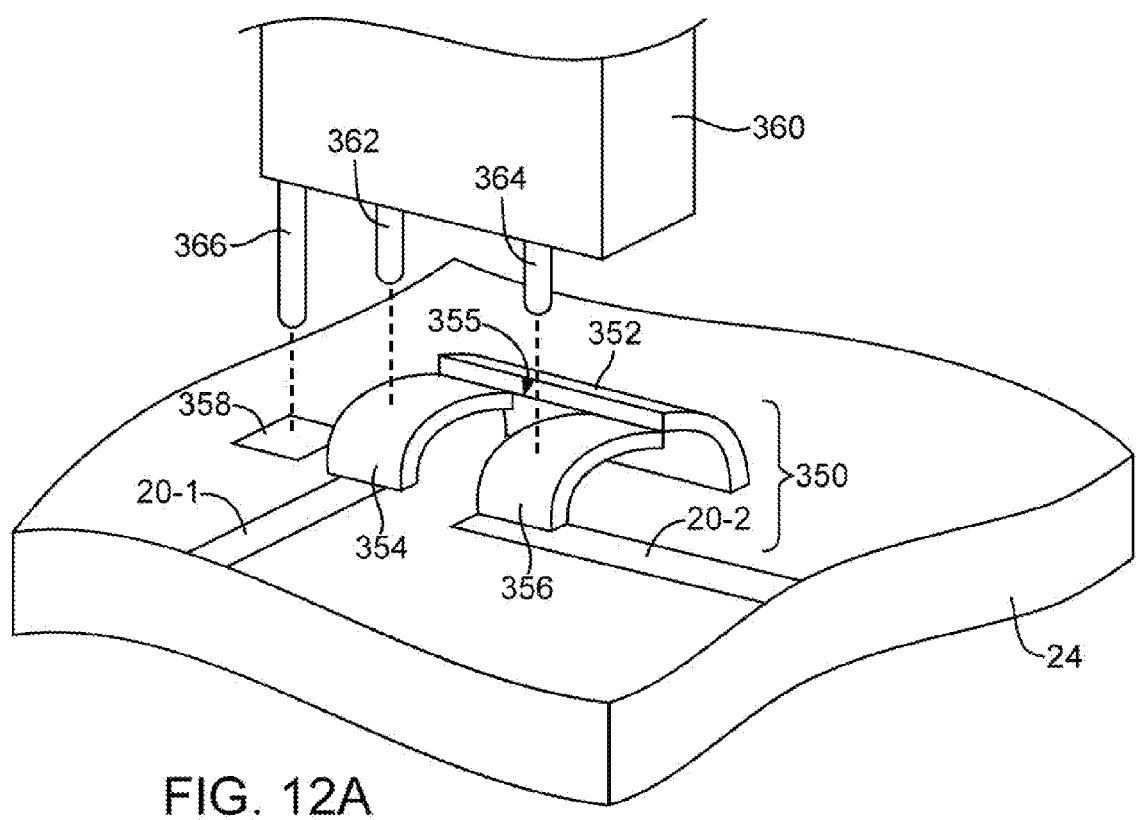
FIG. 12A is a perspective view of an illustrative switch connector having two conductive spring members pushing up against a conductive bridge member in accordance with an embodiment of the present invention.
Figure 12B:
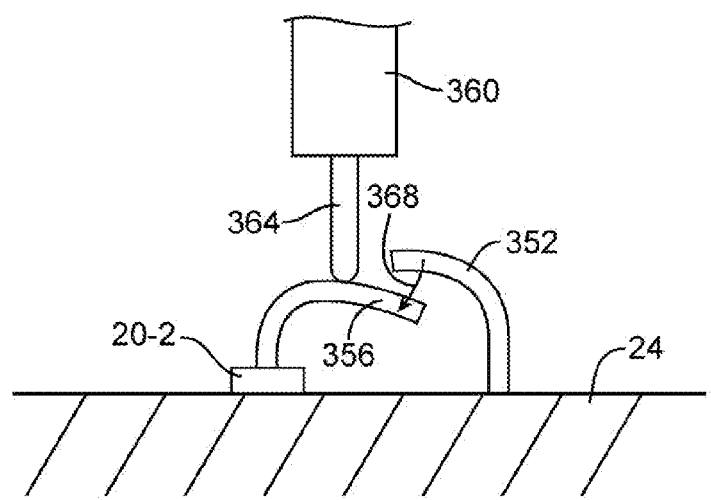
FIG. 12B is a cross-sectional side view of the switch connector of FIG. 12A in the mated state in accordance with an embodiment of the present invention.

FIGS. 12A and 12B show another suitable configuration for the bidirectional switch connector. As shown in the perspective view of FIG. 12A, switch connector 350 may include a first conductive spring member 354, a second conductive spring member 356, and a conductive shorting (bridging) member 352. Conductive shorting member 352 may be formed using a rigid metal beam structure or a flexible conductive sheet. First spring member 354 may be coupled to the transceiver through path 20-1, whereas second spring member 356 may be coupled to the antenna through path 20-2. Switch connector 320 may be mounted on the top surface of PCB 24 (as shown in FIG. 12A) or may be embedded within PCB 24.

When switch connector 350 is in the unmated state, spring members 354 and 356 my press up against an edge portion 355 of shorting member 352. When conductive spring members 354 and 356 are both in physical contact with shorting member 352, radio-frequency signals may be conveyed between the transceiver and the antenna through switch connector 320.

A test probe such as test probe 360 may be used to mate with switch connector 350. Test probe 360 may have a first test pin 362, a second test pin 364, and a ground pin 366. At least one of pins 362, 364, and 366 may be spring-loaded, if desired. Pin 362 may be used to mate with spring member 354, pin 364 may be used to mate with spring member 356, and ground pin 366 may be used to mate with corresponding ground pad 358 formed on the top surface of PCB 24.

FIG. 12B shows a side view of switch connector 350 in the mated state. When test probe 360 is mated with switch connector 350, pin 362 may push down against spring member 354 to cause spring member 354 to bend downwards in the direction of arrow 368, whereas pin 364 may push down against spring member 356 to cause spring member 356 to bend downwards in the direction of arrow 368 (e.g., so that spring members 354 and 356 are temporarily disconnected from bridging member 352.

Test probe 360 need not include both test pins 362 and 364. For example, test probe 360 having conductive signal pin 362 and lacking pin 364 (or having a nonconductive dummy pin 364) may be used during transceiver testing. As another example, test probe 360 having conductive signal pin 364 and lacking pin 362 (or having a nonconductive dummy pin 362) may be used during antenna testing. As another example, test probe 360 having both conductive signal pins 362 and 364 may be used during simultaneous transceiver and antenna testing (e.g., test probe 360 may be a test probe of the type described in connection with FIG. 4).

The foregoing is merely illustrative of the principles of this invention and various modifications can be made by those skilled in the art without departing from the scope and spirit of the invention. The foregoing embodiments may be implemented individually or in any combination.

What is claimed is:

1. A method of testing wireless communications circuitry in an electronic device with test equipment that includes a radio-frequency test probe, wherein the wireless communications circuitry includes a transceiver, antenna circuitry coupled to the transceiver through a transmission line path, and a switch connector interposed in the transmission line path between the transceiver and the antenna circuitry, the method comprising:
    connecting the radio-frequency test probe to the switch connector; and
    while the radio-frequency test probe is connected to the switch connector, gathering radio-frequency test measurements on the antenna circuitry and the transceiver.

2. The method defined in claim 1, wherein gathering the radio-frequency test measurements on the antenna circuitry and the transceiver comprises:
    gathering the radio-frequency test measurements on the antenna circuitry and the transceiver in parallel while the antenna circuitry is electrically decoupled from the transceiver.

3. The method defined in claim 1, wherein the test equipment further comprises a test unit, and wherein gathering the radio-frequency test measurements comprises:
    with the test unit, transmitting radio-frequency test signals to the radio-frequency test probe via a radio-frequency cable.

4. The method defined in claim 1, wherein connecting the radio-frequency test probe to the switch connector comprises:
    decoupling the transceiver from the antenna circuitry.

5. A method of testing wireless communications circuitry in an electronic device with test equipment that includes a radio-frequency test probe, wherein the wireless communications circuitry includes transceiver circuitry, antenna circuitry coupled to the transceiver circuitry through a transmission line path, and a switch connector interposed in the transmission line path between the transceiver circuitry and the antenna circuitry, and wherein the switch connector includes a first conductive member that is coupled to the transceiver circuitry and a second conductive member that is coupled to the antenna, the method comprising:
    connecting the radio-frequency test probe to the switch connector by using a signal conductor in the radio-frequency test probe to depress the second conductive member so that the first conductive member is decoupled from the second conductive member; and
    while the radio-frequency test probe is connected to the switch connector, gathering radio-frequency test measurements on the antenna circuitry, wherein the transceiver circuitry comprises a transceiver selected from the group consisting of: a cellular telephone transceiver, a wireless local area network transceiver, and a satellite navigation system receiver.

6. A method of testing wireless communications circuitry in an electronic device with test equipment that includes a radio-frequency test probe, wherein the wireless communications circuitry includes transceiver circuitry, at least one antenna coupled to the transceiver circuitry through a transmission line path, and a switch connector interposed in the transmission line path between the transceiver circuitry and the antenna, and wherein the switch connector includes a first conductive member that is coupled to the transceiver circuitry and a second conductive member that is coupled to the antenna, the method comprising:
    using a signal conductor in the radio-frequency test probe to make contact with the second conductive member that is coupled to the antenna by mating the radio-frequency test probe with the switch connector to decouple the first conductive member from the second conductive member; and
    using an additional signal conductor in the radio-frequency test probe to make contact with the first conductive member that is coupled to the transceiver circuitry.

7. The method defined in claim 6, wherein the signal conductor and the additional signal conductor comprise test pins, wherein the radio-frequency test probe has a length, and wherein mating the radio-frequency test probe with the switch connector comprises:
    inserting the test pins in notches located between the first and second conductive members; and
    rotating the radio-frequency test probe about a longitudinal axis that is parallel to the length of the test probe so that the first and second conductive members are deflected away from each other.

8. The method defined in claim 6, wherein the radio-frequency test probe includes a blade member in which the signal conductor and the additional signal conductor are formed, and wherein mating the radio-frequency test probe with the switch connector comprises:
    wedging the blade member between the first and second conductive members to decouple the first and second conductive members.

9. The method defined in claim 6, wherein the test equipment further comprises a test unit coupled to the radio-frequency test probe via at least one radio-frequency cable, the method further comprising:
    with the test unit, performing transceiver testing by gathering radio-frequency test measurements on the transceiver circuitry; and
    with the test unit, performing antenna testing by gathering radio-frequency test measurements on the antenna.

10. The method defined in claim 9, wherein the transceiver testing and the antenna testing are simultaneously performed.

11. The method defined in claim 6, wherein at least one of the first and second conductive members comprises a flexible conductive member, and wherein mating the radio-frequency test probe with the switch connector:
    with a tip portion in the radio-frequency test probe, pushing against at least one of the first and second conductive members so that the first and second conductive members are disconnected from each other.

12. The method defined in claim 6, wherein the switch connector further includes a conductive shorting member that electrically connects the first and second conductive members when the switch connector is in an unmated state, and wherein mating the radio-frequency test probe with the switch connector comprises:
    with the radio-frequency test probe, pushing against at least one of the first and second conductive members so that the at least one of the first and second conductive members is disconnected from the conductive shorting member.

13. The method defined in claim 6, wherein the switch connector further includes a conductive shorting member that electrically connects the first and second conductive members when the switch connector is in an unmated state, and wherein mating the radio-frequency test probe with the switch connector comprises:
    with the radio-frequency test probe, pushing against the conductive shorting member so that the conductive shorting member is disconnected from at least one of the first and second conductive members.

14. The method defined in claim 6, wherein the transceiver circuitry comprises a transceiver selected from the group consisting of: a cellular telephone transceiver, a wireless local area network transceiver, and a satellite navigation system receiver.

\* \* \* \* \*